United States Patent
Tripurari et al.

(10) Patent No.: US 10,868,558 B1
(45) Date of Patent: Dec. 15, 2020

(54) SUCCESSIVE APPROXIMATION REGISTER ANALOG-TO-DIGITAL CONVERTER

(71) Applicant: TEXAS INSTRUMENTS INCORPORATED, Dallas, TX (US)

(72) Inventors: Laxmi Vivek Tripurari, Hyderabad (IN); Sovan Ghosh, Paschim Medinipur (IN); Minkle Eldho Paul, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/713,164

(22) Filed: Dec. 13, 2019

(51) Int. Cl.
*H03M 1/46* (2006.01)
*H03M 1/80* (2006.01)

(52) U.S. Cl.
CPC ........... *H03M 1/462* (2013.01); *H03M 1/466* (2013.01); *H03M 1/804* (2013.01)

(58) Field of Classification Search
CPC ....... H03M 1/462; H03M 1/466; H03M 1/804
USPC ..................................... 341/161, 163, 172
See application file for complete search history.

(56) References Cited

U.S. PATENT DOCUMENTS 9,912,341 B2 * 3/2018 Draxelmayr ........ H03M 1/0692
10,135,457 B2 * 11/2018 Chang ................... H03M 1/804

OTHER PUBLICATIONS

Sun, Lei et al. "A Charge Recycling SAR ADC With a LSB-Down Switching Scheme." IEEE Transactions on Circuits and Systems-13 I: Regular Papers, vol. 62, No. 2, Feb. 2015, pp. 356-365.

* cited by examiner

*Primary Examiner* — Khai M Nguyen
(74) *Attorney, Agent, or Firm* — John R. Pessetto; Charles A. Brill; Frank D. Cimino

(57) ABSTRACT

An analog-to-digital converter (ADC) includes a capacitive digital-to-analog converter (CDAC), a comparator coupled to the CDAC, and a successive approximation register (SAR) control circuit coupled to the CDAC and the comparator. The SAR control circuit is configured to successively select bits of a digital output value. The SAR control circuit is also configured to, after selection of the bits of the digital output value: maintain a state of first switches of the CDAC applied to select a most significant bit of the digital output value, and revert second switches of the CDAC applied to select bits of the digital output value having significance lower than the most significant bit to a state of the second switches prior to selection of the most significant bit.

20 Claims, 11 Drawing Sheets

SUCCESSIVE APPROXIMATION REGISTER ANALOG-TO-DIGITAL CONVERTER

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations is typically decided by the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten bit resolution only ten iterations are required, and for twenty bits of resolution only twenty iterations are required, considering no redundant decisions.

SUMMARY

A successive approximation register (SAR) analog-to-digital converter (ADC) that reduces input signal dependent charge drawn from a reference voltage circuit by reconfiguring the capacitive digital-to-analog converter (CDAC) after conversion is complete is disclosed herein. In one example, an ADC includes a CDAC, a comparator coupled to the CDAC, and a successive approximation register (SAR) control circuit coupled to the CDAC and the comparator. The SAR control circuit is configured to successively select bits of a digital output value. The SAR control circuit is also configured to, after selection of the bits of the digital output value: maintain a state of first switches of the CDAC applied to select a most significant bit of the digital output value, and revert second switches of the CDAC applied to select bits of the digital output value having significance lower than the most significant bit to a state of the second switches prior to selection of the most significant bit.

In another example, a method includes digitizing a signal in a successive approximation register (SAR) analog-to-digital converter (ADC) to produce a digital output value. After determining values of the bits of the digital output value, the SAR ADC reverts switches, of a CDAC of the SAR ADC, applied to select all but a most significant bit of the digital output value to a state of the switches prior to selection of the most significant bit of the digital output value.

In a further example, an analog-to-digital converter (ADC) includes a CDAC, a comparator coupled to the CDAC, and a SAR control circuit coupled to the CDAC and the comparator. The SAR control circuit is configured to set switches of the CDAC to compare an input signal to be digitized to a digital value representative of the input signal, and successively select each bit of a digital output value. The SAR control circuit is also configured to, after selection of all bits of the digital output value, set the switches of the CDAC to a configuration that reduces input signal dependent charge drawn from a reference voltage circuit coupled to the CDAC.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection.

Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In a capacitive digital-to-analog converter (CDAC) based successive approximation register (SAR) analog-to-digital converter (ADC) the charge drawn from a reference voltage circuit by the CDAC is a function of (is dependent on) the voltage of the input signal being digitized. The input signal dependent charge drawn from the reference voltage circuit can cause the ADC to be non-linear. To minimize this non-linearity, some reference voltage circuits have a low output impedance, which increases the power consumption of the reference voltage circuits. Other SAR ADCs designs apply a multi-stage CDAC, where one array of capacitors is capacitively coupled to another. Such SAR ADCs reduce maximum signal dependent current drawn, but the variation of current drawn over the input signal range is still substantial. Yet other SAR ADCs include an auxiliary CDAC that compensates for the signal dependent charge, but requires increased circuit area and close matching of the auxiliary CDAC to the main CDAC of the SAR ADC.

For an N-bit split capacitor CDAC (without a coupling capacitor), the charge drawn from the reference voltage circuit with a positive or negative full-scale input signal (minimum charge is drawn with full scale input) is:

$$Q_{min} = 2^{N-2} + \frac{2^{N-2}}{4} + \sum_{k=3}^{N}\left(\frac{2^{N-k}}{2^k}\right) \quad (1)$$

The charge drawn from the reference voltage circuit with a mid-scale input signal (maximum charge is drawn with mid-scale input) is:

$$Q_{max} = 2^{N-2} + \frac{2^{N-2}}{4} + \sum_{k=3}^{N}\left(\frac{2^{N-1}+2^{N-k}}{2^k}\right) \quad (2)$$

The shape (range) of the charge drawn is:

$$\Delta q = Q_{max} - Q_{min} = \sum_{k=3}^{N}\left(\frac{2^{N-1}}{2^k}\right) = 2^{N-3} - 0.5 \quad (3)$$

Equation (3) shows that the charge drawn from the reference voltage circuit is not input signal dependent for selection of the first and second bits, and is input signal dependent for selection of bits that are less significant than the second bit.

Figure 1:
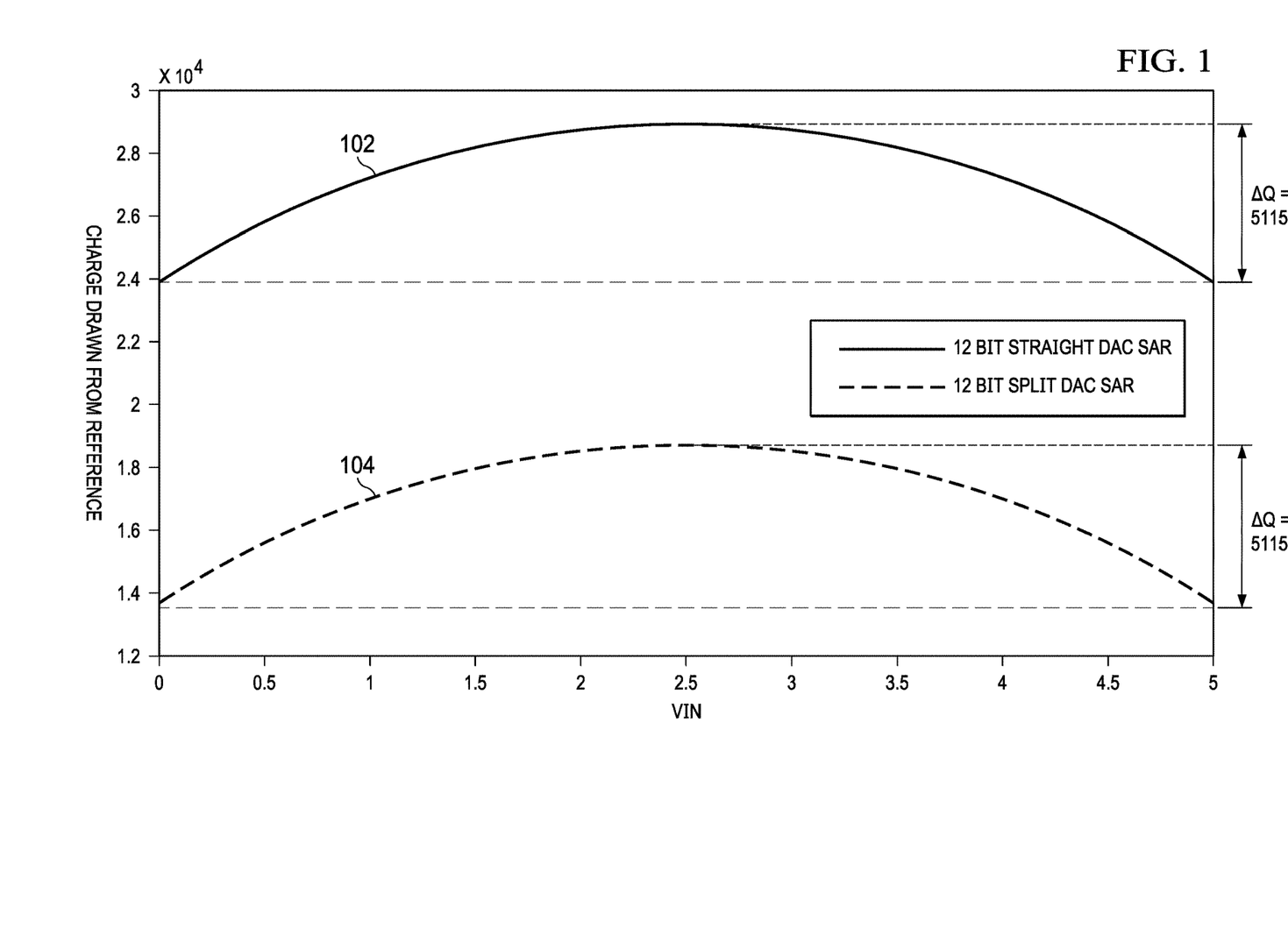
FIG. 1 shows charge drawn from a voltage reference circuit by a capacitive digital-to-analog converters (CDAC) in a successive approximation register (SAR) analog-to-digital converter (ADC)

FIG. 1 shows charge drawn from a voltage reference circuit by CDACs in a SAR ADC. The curve 102 shows variation (shape), with input signal voltage, of the charge drawn from a reference voltage circuit by SAR ADC that includes a differential CDAC without split capacitors. The curve 104 shows variation (shape), with input signal voltage, of the charge drawn from a reference voltage circuit by SAR ADC that includes a differential CDAC with split capacitors. The total charge drawn from the reference voltage circuit is lower for the split capacitor CDAC, but the variation (shape) of charge drawn from the reference voltage circuit is the same for both CDACs.

Figure 2:
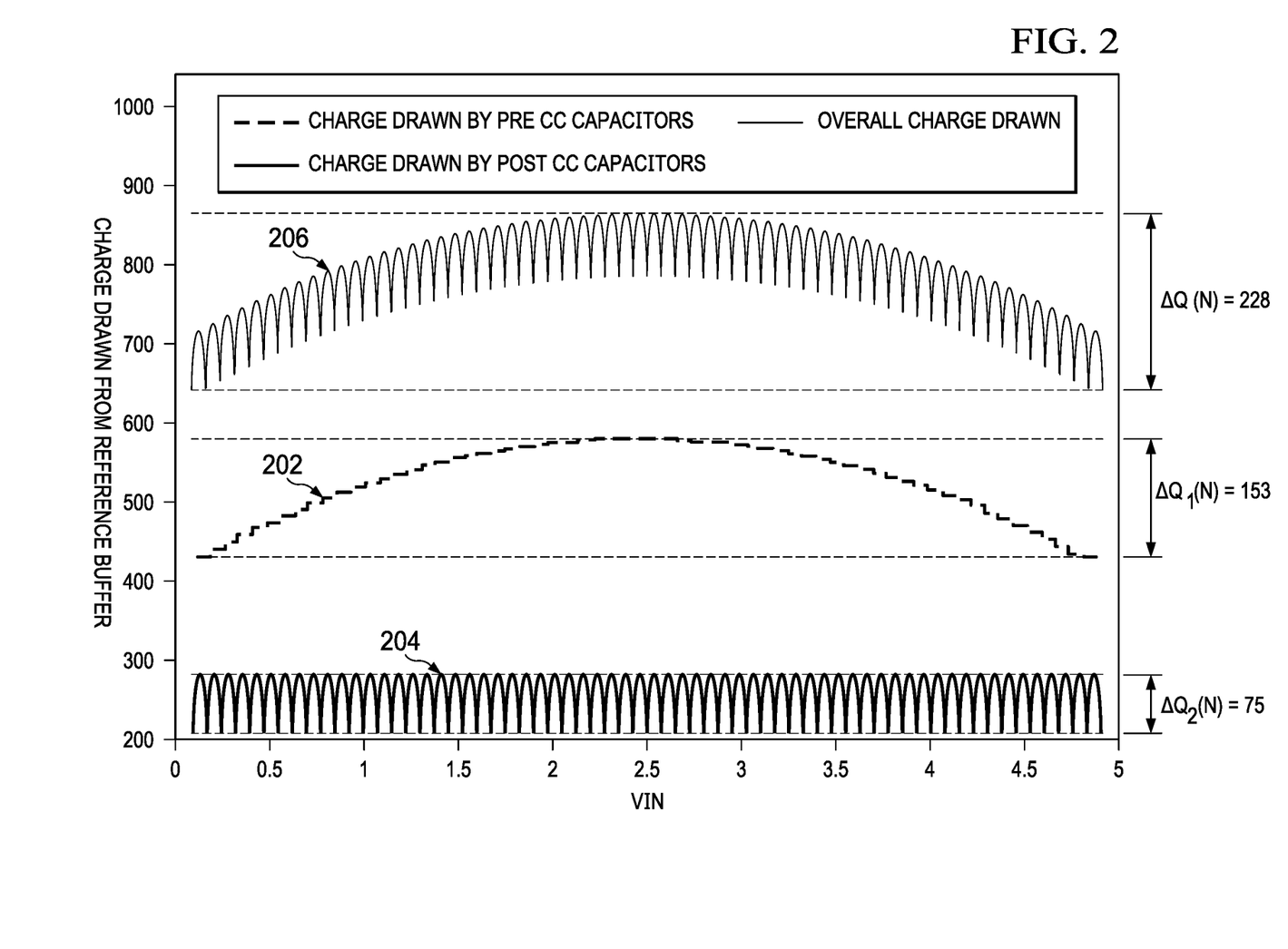
FIG. 2 shows charge drawn from a voltage reference circuit by a bridge capacitor based CDAC in a successive approximation register (SAR) analog-to-digital converter (ADC)

FIG. 2 shows charge drawn from a voltage reference circuit by a bridge capacitor based CDAC with split capacitors in a SAR ADC. The curve 202 shows variation, with input signal voltage, of the charge drawn from a reference voltage circuit by the capacitors on the most significant bit (MSB) side of the coupling capacitor of the CDAC. The curve 204 shows variation, with input signal voltage, of the charge drawn from the reference voltage circuit by the capacitors on the least significant bit (LSB) side of the coupling capacitor of the CDAC. The curve 206 shows the overall charge drawn from the reference voltage circuit by the CDAC. The charge drawn by the bridge capacitor based CDAC is lower than that drawn by the SAR ADCs represented in FIG. 1, but the charge variation (shape) with input voltage exhibits a similar curve. The SAR ADC disclosed herein reduces the variation in charge drawn from the reference voltage circuit by reverting at least some switches of the CDAC to a pre-bit-decision state after digitization is complete. For example, some implementations of the SAR ADCs disclosed herein revert all but switches applied to select the MSB of the digital output value to a pre-bit decision state. By reducing the signal dependence of charge drawn from the reference voltage circuit by the CDAC, the SAR ADC disclosed herein allows the output impedance of the reference voltage circuit to be relaxed, and the power consumed by the reference voltage circuit to be decreased, while improving the linearity of the ADC.

Figure 3A:
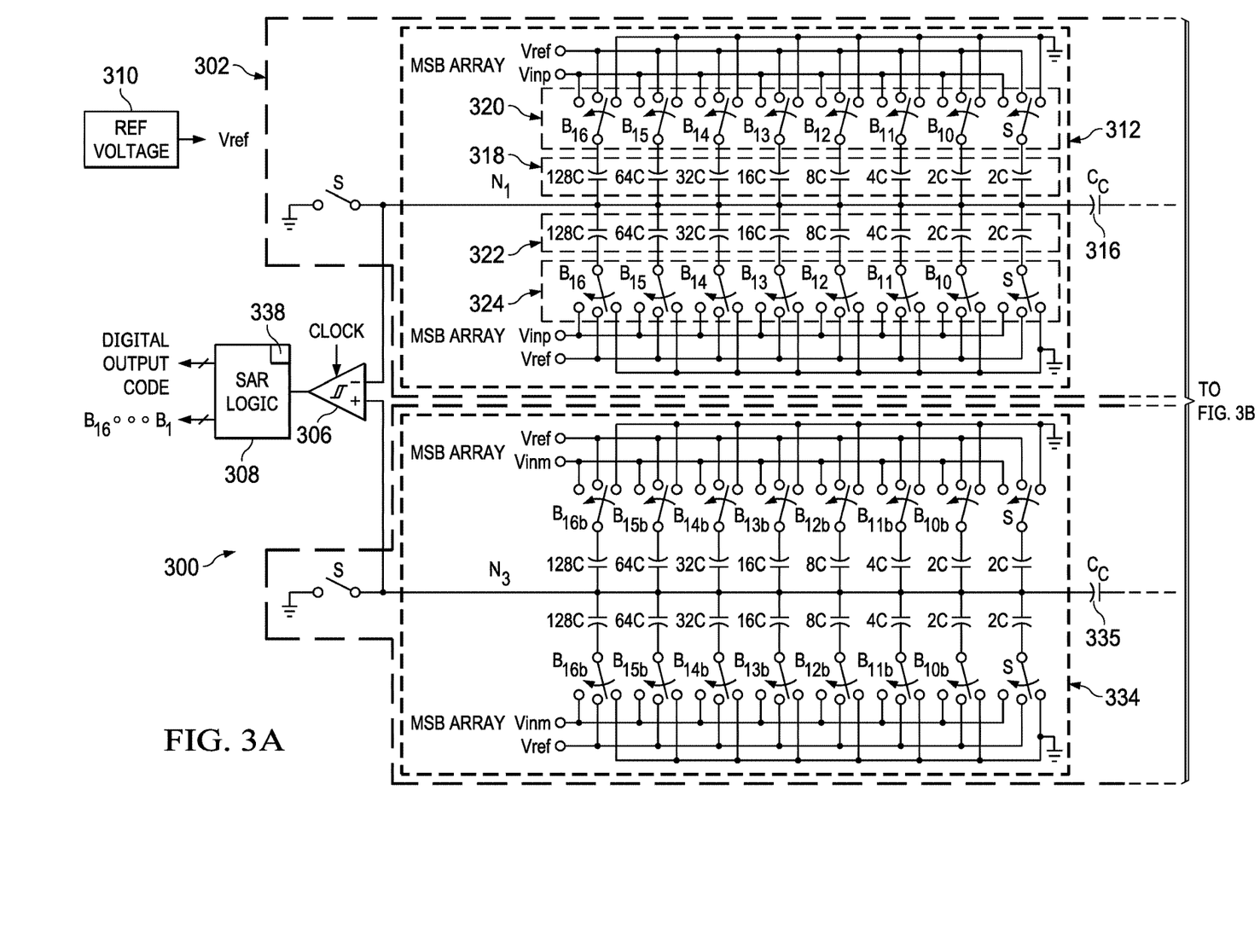
FIGS. 3A and 3B shows an example differential split CDAC based SAR ADC that applies a signal dependent charge reduction technique in accordance with this description.
Figure 3B:
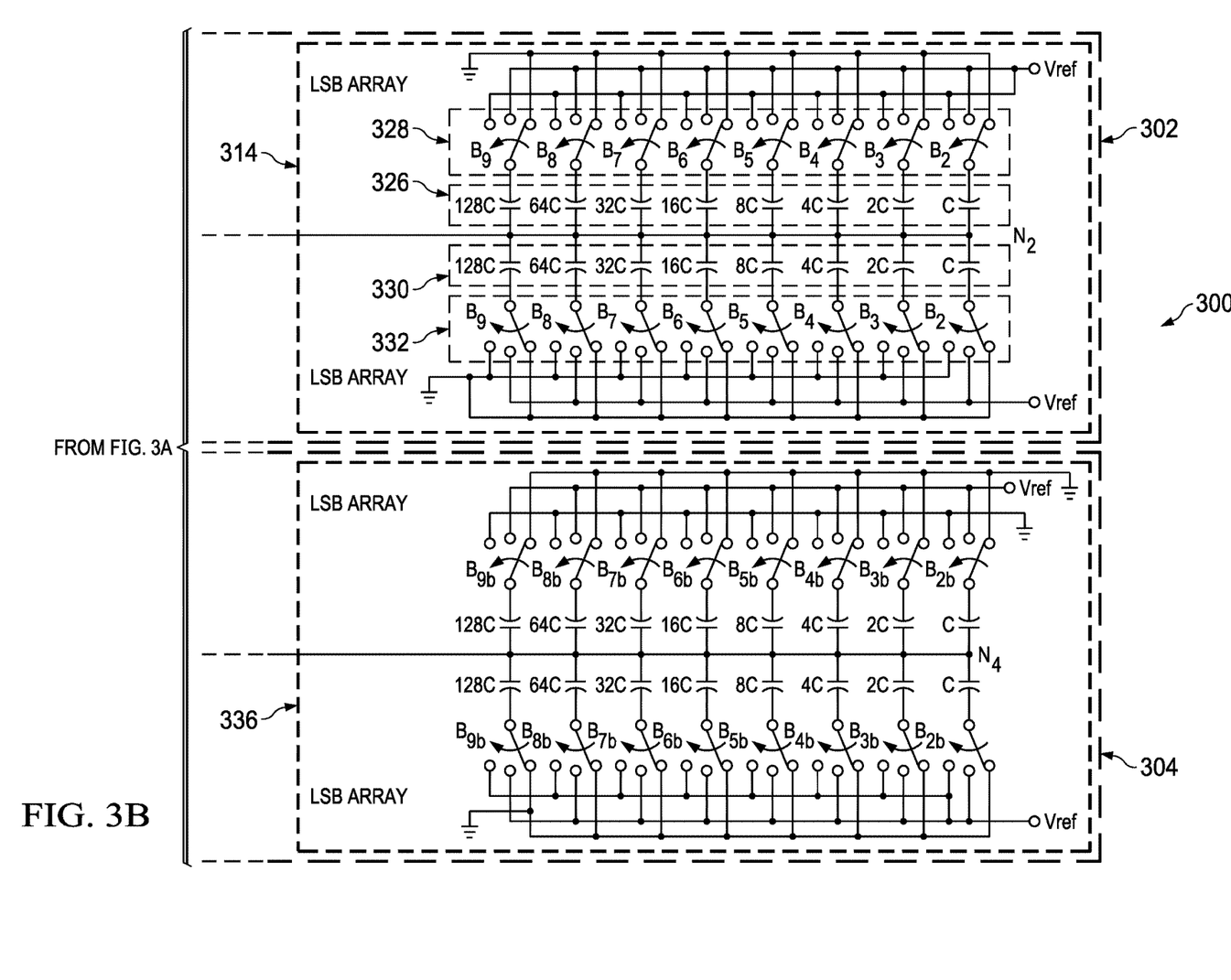

FIGS. 3A and 3B shows an example differential split CDAC based SAR ADC 300 that applies a signal dependent charge reduction technique in accordance with this description. The SAR ADC 300 includes a CDAC 302, a CDAC 304, a comparator 306, a SAR control circuit 308, and a reference voltage circuit 310. The comparator 306 includes an input coupled to an output of the CDAC 302, an input coupled to an output of the CDAC 304, and an output coupled to an input of the SAR control circuit 308. The SAR control circuit 308 includes outputs coupled to the CDAC 302 and outputs coupled to the CDAC 304. The SAR control circuit 308 is configured to successively select the values of bits of a digital output value by controlling the CDAC 302 and the CDAC 304 to compare an input signal to be digitized to a digital value representative of the input signal.

The CDAC 302 includes an MSB stage 312 coupled to an LSB stage 314 via a bridge capacitor 316. The MSB stage 312 includes an array of binary weighted capacitors 318, an array of binary weighted capacitors 322, switches 320, and switches 324. The top plates of the binary weighted capacitors 318 and the top plates of the binary weighted capacitors 322 are coupled to the bridge capacitor 316. The bottom plates of the binary weighted capacitors 318 are coupled to the switches 320. The switches 320 switchably connect the binary weighted capacitors 318 to an input signal, the reference voltage circuit 310, or ground as controlled by the SAR control circuit 308 to select the most significant bits of the digital value representing the input signal. The bottom plates of the binary weighted capacitors 322 are coupled to the switches 324. The switches 324 switchably connect the binary weighted capacitors 322 to the input signal, the reference voltage circuit 310, or ground as controlled by the SAR control circuit 308 to select the most significant bits of the digital value representing the input signal.

The LSB stage 314 includes an array of binary weighted capacitors 326, an array of binary weighted capacitors 330, switches 328, and switches 332. The top plates of the binary weighted capacitors 326 and the top plates of the binary weighted capacitors 330 are coupled to the bridge capacitor 316. The bottom plates of the binary weighted capacitors 326 are coupled to the switches 328. The switches 328 switchable connect the binary weighted capacitors 326 to the reference voltage circuit 310 or ground as controlled by the SAR control circuit 308 to select the least significant bits of the digital value representing the input signal. The bottom plates of the binary weighted capacitors 330 are coupled to the switches 332. The switches 332 switchable connect the binary weighted capacitors 330 to the reference voltage circuit 310 or ground as controlled by the SAR control circuit 308 to select the least significant bits of the digital value representing the input signal.

The CDAC 304 is similar or identical to the CDAC 302. The CDAC 304 includes an MSB stage 334 coupled to an LSB stage 336 via a coupling capacitor 335. The MSB stage 334, the LSB stage 336, and the coupling capacitor 335 are respectively similar or identical to the MSB stage 312, the LSB stage 314, and the bridge capacitor 316. The SAR control circuit 308 controls the switches of the CDAC 304 to select the bits of the digital value representing the input signal.

The SAR control circuit 308 performs a binary search to select the values of the bits of the digital value representing the input signal. With each step of the binary search, the SAR control circuit 308 manipulates the switches coupled to the binary weighted capacitors corresponding to the bit whose value is being determined. When the binary search is complete, and all bit values of the digital value representing the input signal have been selected, the SAR control circuit 308 sets the switches of the CDACs 302 and 304 to a configuration that reduces input signal dependent charge drawn from the reference voltage circuit 310 coupled to the CDAC. Some implementations of the SAR control circuit 308 revert at least some of the switches of the CDAC 302 and the CDAC 304 to the state of the switches prior to the switch states established in the binary search. For example, the SAR control circuit 308 may successively revert switches of the CDAC 302 and the CDAC 304 to the pre-bit-search state starting with switches associated with the least significant bit of the CDAC 302 and the CDAC 304, and thereafter successively reverting switches associated with bits of higher significance to the pre-search state.

In implementations of the SAR ADC 300, the CDAC 302 and the CDAC 304 include a number of binary weighted capacitors and associated switches selected to provide a desired analog-to-digital conversion resolution. In some implementations of the SAR ADC 300, the CDAC 302 and the CDAC 304 are implemented as a single stage with or without split capacitors. The techniques for reducing signal dependent charge described herein, including reversion of switch states, are applicable to such implementations.

Figure 4:
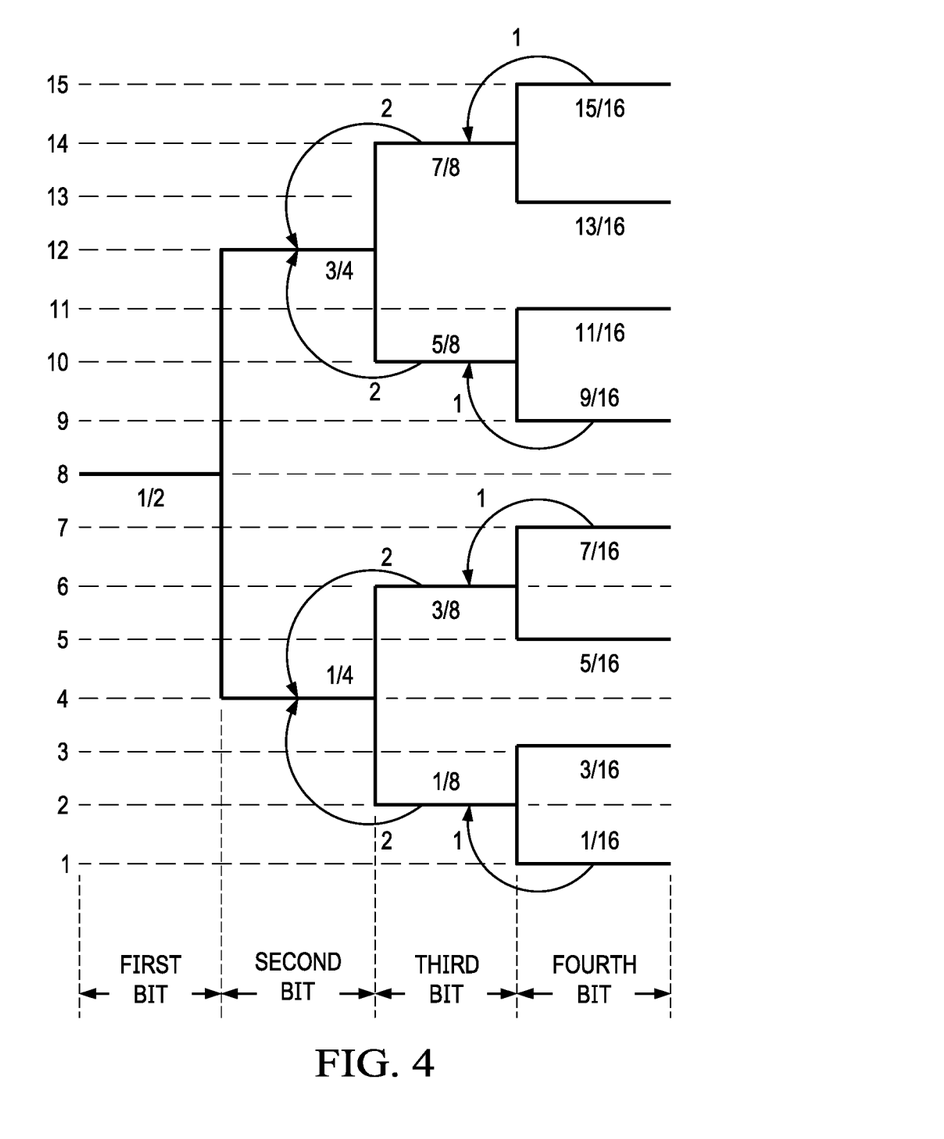
FIG. 4 shows an example of switch control in a CDAC based SAR ADC in accordance with this description.

FIG. 4 shows an example of switch control in a four-bit CDAC based SAR ADC in accordance with this description. In FIG. 4, the SAR ADC performs a binary search to successively select the values of the 1st, 2nd, 3rd, and 4th bits of the digital value representing the input signal. After selection of the value of the 4th bit (i.e., after digitization is complete), the SAR ADC reverts the switches of the CDAC set to select the value of the 4th bit to the state of the switches prior to selection of the value of the 4th bit. After reversion of the switches of the CDAC set to select the value of the 4th bit to the pre-bit-search state, the SAR ADC reverts the switches of the CDAC set to select the value of the 3rd bit to the state of the switches prior to selection of the value of the 3rd bit. Reversion of the switches associates with the 4th and 3rd bits reduces input signal dependent charge in the SAR ADC. In this 4-bit example (or any such implementation), reversion of the switches set to select the 1st and 2nd bits would not reduce signal dependent charge drawn as indicated by equation (3).

Figure 5:
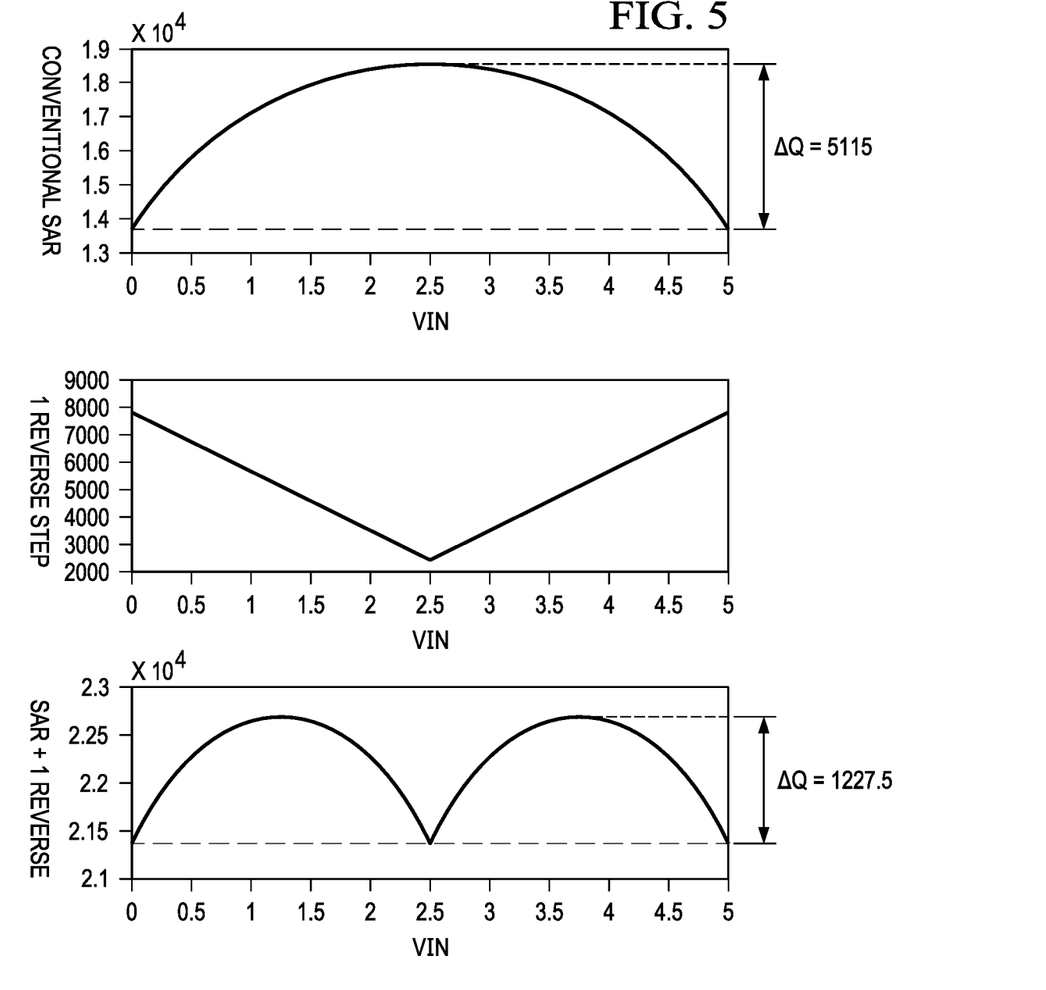
FIG. 5 shows an example of charge drawn from a voltage reference circuit with one post-conversion reversion step.
Figure 6:
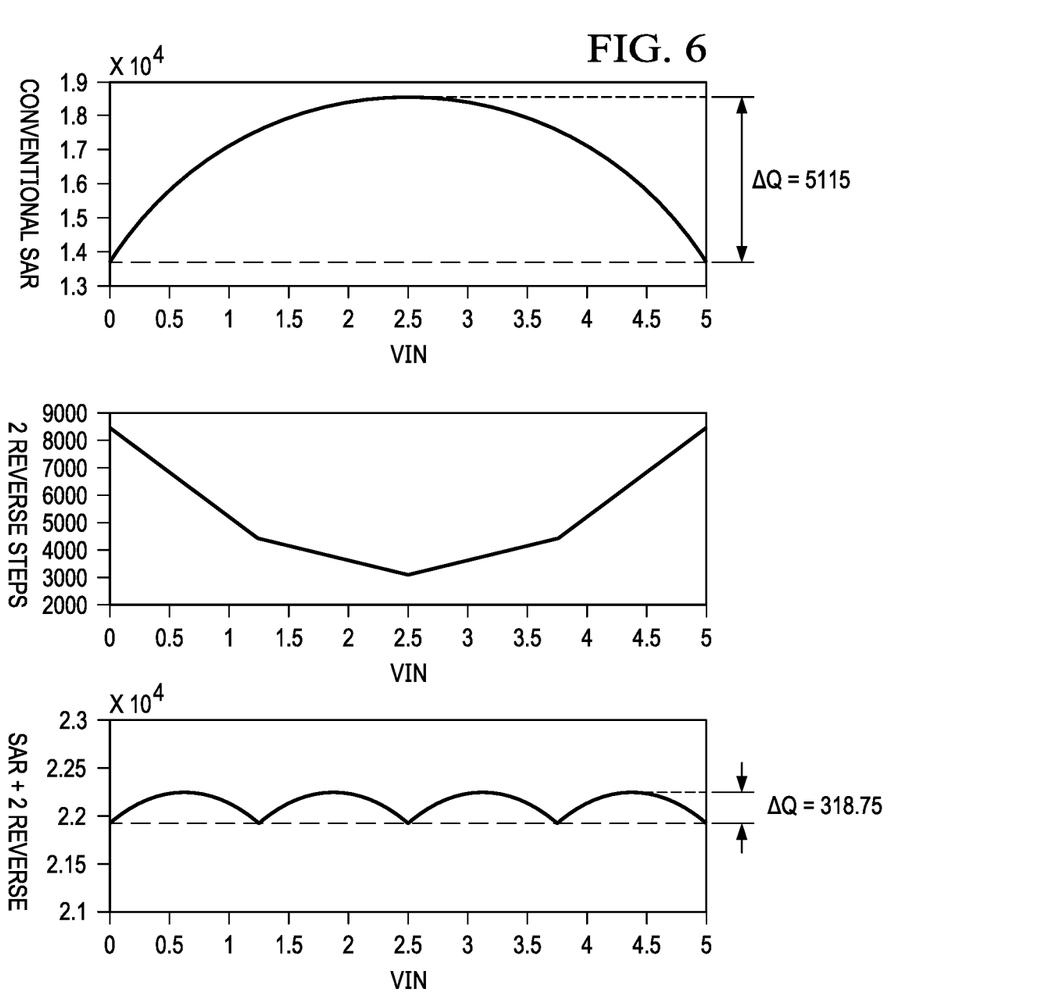
FIG. 6 shows an example of charge drawn from a voltage reference circuit with two post-conversion reversion steps.

FIGS. 5 and 6 show examples of charge drawn from a voltage reference circuit with one post-conversion reversion step and two post-conversion reversion steps respectively for a 12-bit SAR ADC (N=12). FIGS. 5 and 6 show that as the number of reversion steps approaches N−2, the total charge drawn in the reversion steps converges to the complement of the input dependent charge (except the constant part) drawn by the SAR ADC during digitization, thus compensating for the input signal dependent charge drawn during digitization.

Figure 7:
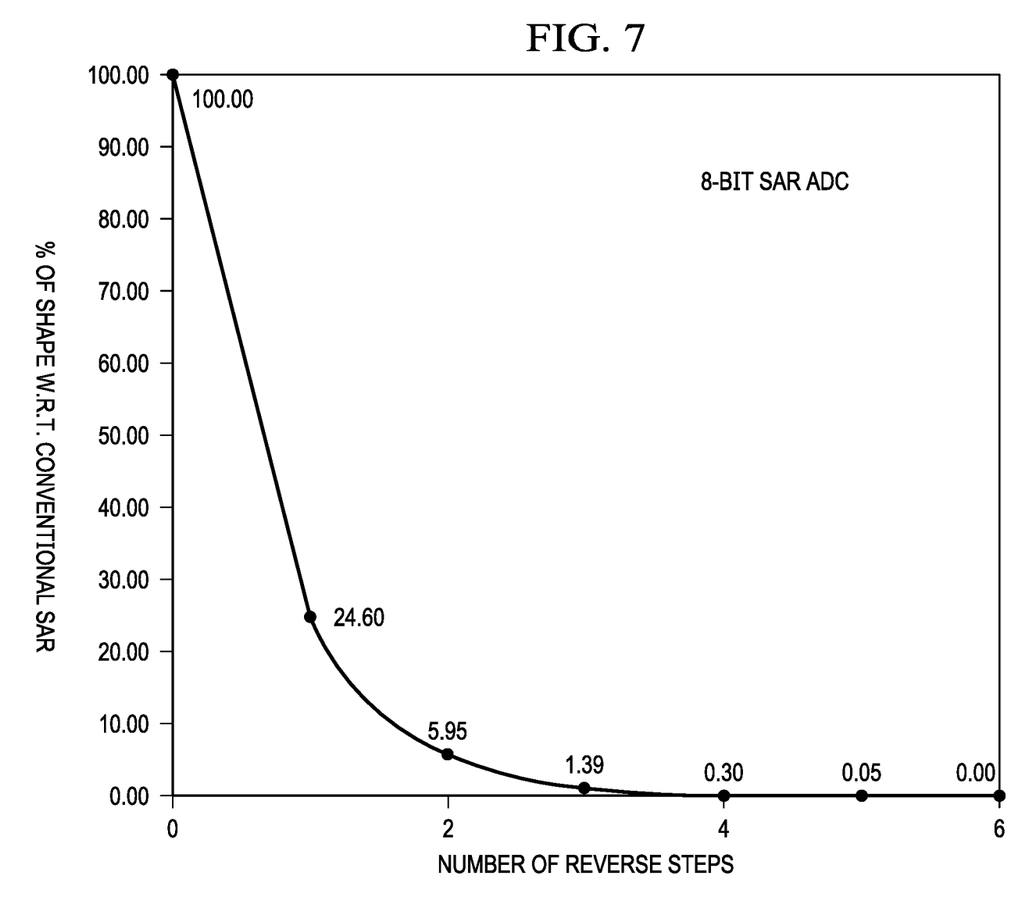
FIG. 7 shows the effects of different numbers of reversion steps on charge drawn from a voltage reference circuit by the CDAC of a SAR ADC.

FIG. 7 shows a graph of the effects of different numbers of reversion steps on charge drawn from a voltage reference circuit by the CDAC of a SAR ADC. For an N-bit SAR ADC, with K reversion steps the reference charge shape for a split capacitor CDAC is expressed as:

$$\Delta q_{N,K} = \frac{2^{N-3-2K} - \frac{1}{2^{K+1}}}{2^{N-3} - \frac{1}{2^1}}$$

Two reversion steps suppress the shape of the input dependent charge by a factor of about 16. Accordingly, two reversion steps are applied to sufficiently reduce signal dependent charge in some implementations of the SAR ADCs disclosed herein.

Figure 8:
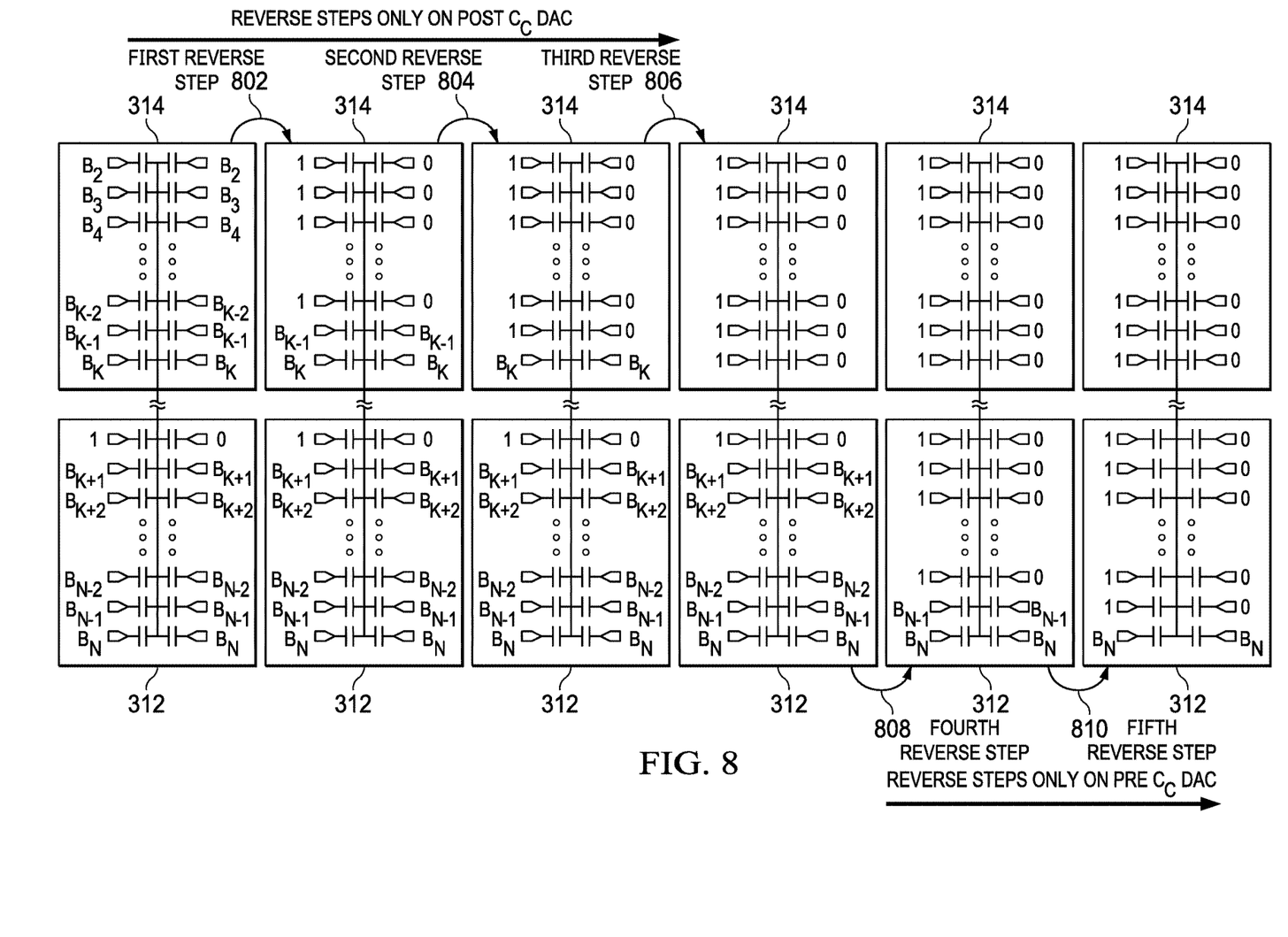
FIG. 8 shows an example reversion of switch settings in a bridge-capacitor based CDAC of a SAR ADC in accordance with this description.

In the SAR ADC 300, reversion of switch settings is applied to both stages of the CDAC. That is, in the CDAC 302 reversion is applied to both the MSB stage 312 and the LSB stage 314, and in CDAC 304 reversion is applied to both the MSB stage 334 and the LSB stage 336. FIG. 8 shows an example reversion of switch settings in the CDAC 302 in accordance with this description. When digitization of a sample of the input signal is complete, the SAR control circuit 308 executes reversion steps 802, 804, and 806 to revert the switches of LSB stage(s) 314 (and 336) to a pre-bit-selection state, and thereafter executes revision steps 808 and 810 to revert the switches of the MSB stage(s) 312 (and 334), except switches of the MSB stage(s) 312 (and 334) applied to select the MSB, to a pre-bit-selection state. Reversion steps are applied to both the MSB stage(s) 312 (and 334) and the LSB stage(s) 314 (and 336) because charge drawn by the MSB stage(s) 312 (and 334) and the LSB stage(s) 314 (and 336) are both signal dependent.

In reversion step 802, the SAR control circuit 308 reverts switches of the LSB stage(s) 314 (and 336) applied to select all but the two most significant bits selected via the LSB stage(s) 314 (and 336) to a pre-bit-selection state. In reversion step 804, the SAR control circuit 308 reverts switches of the LSB stage(s) 314 (and 336) applied to a second MSB (also referred to as MSB−1) selected via the LSB stage(s) 314 (and 336) to a pre-bit-select state. In reversion step 806, the SAR control circuit 308 reverts switches of the LSB stage(s) 314 (and 336) applied to an MSB selected via the LSB stage(s) 314 (and 336) to a pre-bit-select state. Thus, after reversion step 806, all switches of the LSB stage(s) 314 (and 336) have been reverted to a pre-bit-selection state.

After all switches of the LSB stage(s) 314 (and 336) have been reverted to a pre-bit-selection state, in reversion step 808, the SAR control circuit 308 reverts switches of the MSB stage(s) 312 (and 334) applied to select all but the two most significant bits selected via the MSB stage(s) 312 (and 334) to a pre-bit-selection state. In reversion step 810, the SAR control circuit 308 reverts switches of the MSB stage(s) 312 (and 334) applied to a second MSB (also referred to as MSB−1) selected via the MSB stage(s) 312 (and 334) to a pre-bit-select state. Thus, after reversion step 810, all switches of the CDAC 302 (except switches used to select the MSB of the digital output value) have been reverted to a pre-bit-selection state.

Some implementations of the SAR ADC 300, to reduce reversion time, reduce the number of reversion steps performed by combining reversion steps applied to the LSB stage(s) 314 (and 336) and reversion steps applied to the MSB stage(s) 312 (and 334). For example, in an implementation of the SAR ADC 300, the SAR control circuit 308 performs reversion step 802 concurrently with reversion step 808, and performs reversion step 804 concurrently with reversion step 810. Concurrent execution of the reversion step 802 and 808, and 804 and 810 results in a slight, but acceptable, increase in signal dependent charge draw in exchange for a substantial reduction in reversion time (e.g., 5 steps versus 2 steps).

Figure 9:
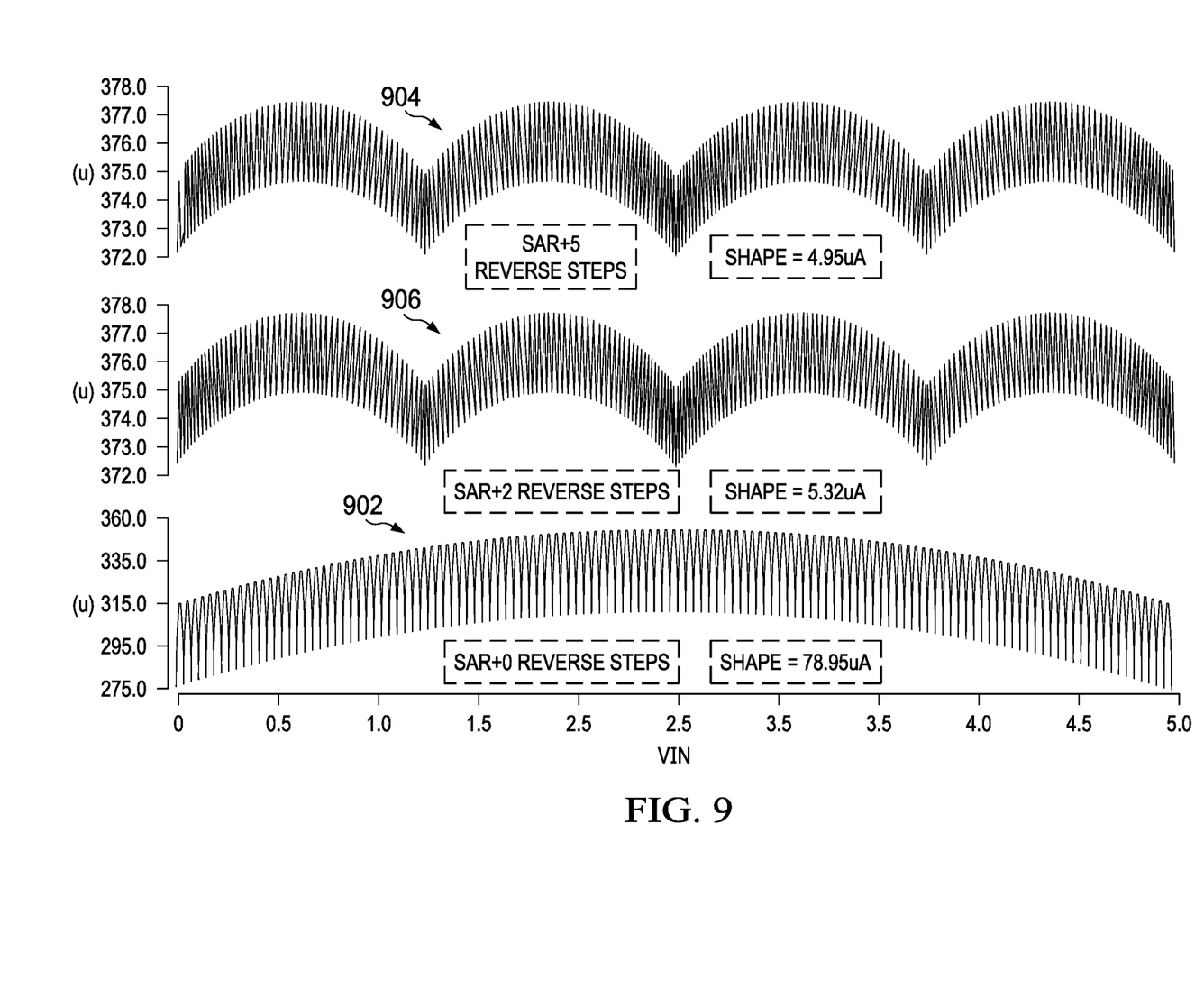
FIG. 9 shows examples of charge drawn from a voltage reference circuit in bridge-capacitor based CDAC of a SAR ADC using different numbers of reversion steps.

FIG. 9 shows examples of charge drawn from a voltage reference circuit in bridge-capacitor based DAC of a SAR ADC using different numbers of reversion steps. Signal 902 represents signal dependent current draw in the SAR ADC 300 with no reversion steps. Signal 904 represents signal dependent current draw in the SAR ADC 300 with five reversion steps per FIG. 8. Signal 906 represents signal dependent current draw in the SAR ADC 300 with two reversion steps, where a first reversion step combines steps 802 and 808 of FIG. 8, and a second reversion step combines steps 804 and 810 of FIG. 8.

FIG. 9 shows that signal dependent current drawn with no reversion steps is about 16 time greater than the signal dependent current drawn with five reversion steps per FIG. 8). The signal dependent current drawn using only two reversion steps increases signal dependent current by about 7% relative to five reversion steps which is acceptable considering the reduction in reversion time provided by employing only two reversion steps.

Figure 10:
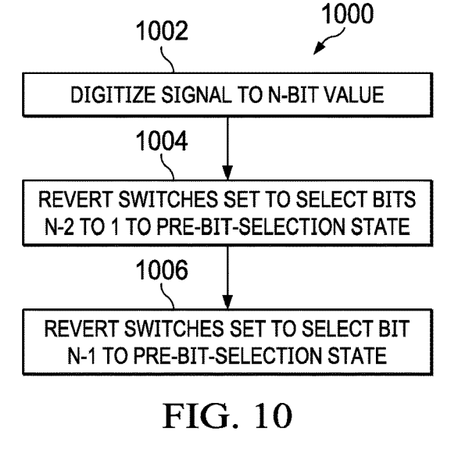
FIG. 10 shows a flow diagram for an example method for reducing the charge drawn from a voltage reference circuit by a CDAC of a SAR ADC.

FIG. 10 shows a flow diagram for an example method 1000 for reducing the charge drawn from a voltage reference circuit by a CDAC of an N-bit SAR ADC. Though depicted sequentially as a matter of convenience, at least some of the actions shown can be performed in a different order and/or performed in parallel. Additionally, some implementations may perform only some of the actions shown. Operations of the method 1000 are performed by an N-bit SAR ADC that includes a CDAC.

In block 1002, the N-bit SAR ADC executes a binary search to digitize an input signal and generate an N-bit digital output value representative of the input signal.

In block 1004, the N-bit SAR ADC reverts the switches of the CDAC applied to determine a value of bits N−2 to 1, where bit N is the MSB (i.e., all bits except the two most significant bits) to a pre-bit-selection state (i.e., the state of the switches prior to manipulation for bit value selection).

In block 1006, the N-bit SAR ADC reverts the switches of the CDAC applied to determine a value of bit N−1 to a pre-bit-selection state. The state of the switches of the CDAC applied to determine a value of the MSB remain as set by the binary search process. The operations of blocks 1004 and 1006 reduce the signal dependent charge drawn from the reference voltage circuit by a factor of about 16.

Figure 11:
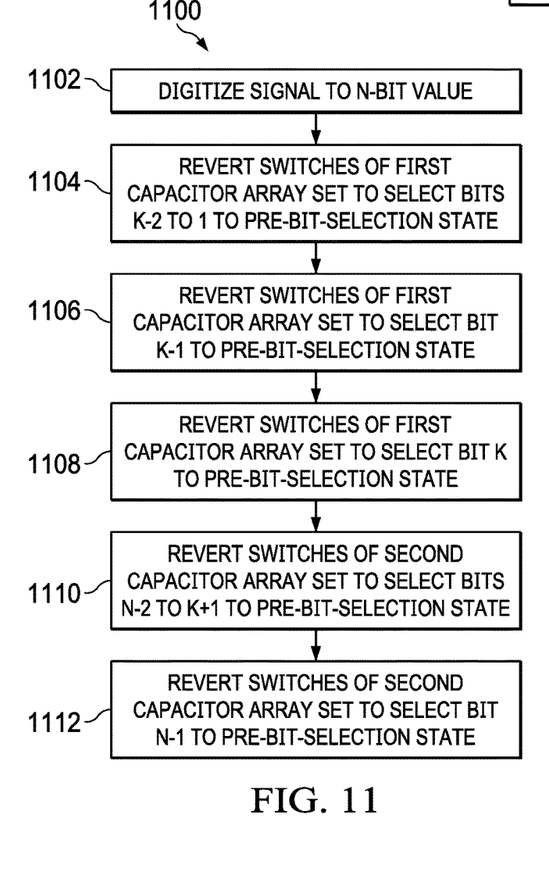
FIG. 11 shows a flow diagram for an example method for reducing the charge drawn from a voltage reference circuit by a bridge-capacitor based CDAC of a SAR ADC.

FIG. 11 shows a flow diagram for an example method 1100 for reducing the charge drawn from a voltage reference circuit in a bridge-capacitor based CDAC of a SAR ADC. Though depicted sequentially as a matter of convenience, at least some of the actions shown can be performed in a different order and/or performed in parallel. Additionally, some implementations may perform only some of the actions shown. Operations of the method 1100 are performed by an implementation of the SAR ADC 300.

In block 1102, the SAR ADC executes a binary search to digitize an input signal and generate an N-bit digital output value representative of the input signal.

In block 1104, the SAR ADC 300 reverts the switches of the LSB stage(s) 314 (and 336) applied to determine a value of bits K−2 through 1, where bit K is the MSB determined by manipulation of switches of the LSB stage(s) 314 (and 336), to a pre-bit-selection state.

In block 1106, the SAR ADC 300 reverts the switches of the LSB stage(s) 314 (and 336) applied to determine a value of bit K−1 to a pre-bit-selection state.

In block 1108, the SAR ADC 300 reverts the switches of the LSB stage(s) 314 (and 336) applied to determine a value of bit K to a pre-bit-selection state.

In block 1110, the SAR ADC 300 reverts the switches of the MSB stage(s) 312 (and 334) applied to determine a value of bits N−2 through K+1, where bit N is the MSB of the SAR ADC 300 and bit K+1 is the LSB determined by manipulation of switches of the MSB stage(s) 312 (and 334), to a pre-bit-selection state.

In block 1112, the SAR ADC 300 reverts the switches of the MSB stage(s) 312 (and 334) applied to determine a value of bit N−1 to a pre-bit-selection state. The state of the switches of the MSB stage(s) 312 (and 334) applied to determine a value of the MSB (bit N) remain as set by the binary search process. The operations of blocks 1104-1112 reduce the signal dependent charge drawn from the reference voltage circuit by a factor of about 16.

Figure 12:
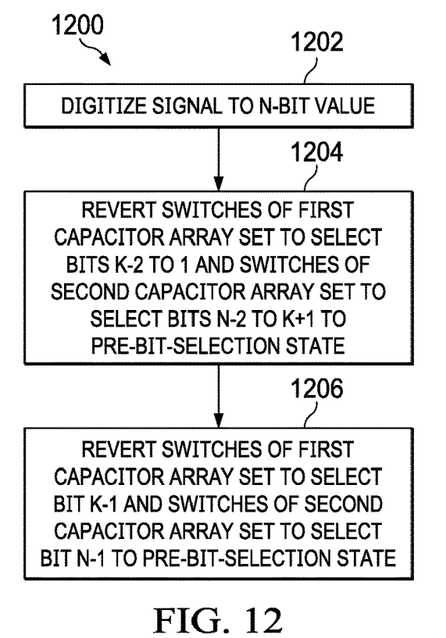
FIG. 12 shows a flow diagram for an example method for reducing the charge drawn from a voltage reference circuit by a bridge-capacitor based CDAC of a SAR ADC.

FIG. 12 shows a flow diagram for an example method 1200 for reducing the charge drawn from a voltage reference circuit in a bridge-cap based CDAC of a SAR ADC. Though depicted sequentially as a matter of convenience, at least some of the actions shown can be performed in a different order and/or performed in parallel. Additionally, some implementations may perform only some of the actions shown. Operations of the method 1200 are performed by an implementation of the SAR ADC 300.

In block 1202, the SAR ADC executes a binary search to digitize an input signal and generate an N-bit digital output value representative of the input signal.

In block 1204, the SAR ADC 300 reverts the switches of the LSB stage(s) 314 (and 336) applied to determine a value of bits K−2 through 1, where bit K is the MSB determined by manipulation of switches of the LSB stage(s) 314 (and 336), to a pre-bit-selection state. In block 1204, the SAR ADC 300 also reverts the switches of the MSB stage(s) 312 (and 334) applied to determine a value of bits N−2 through K+1, where bit N is the MSB of the SAR ADC 300 and bit K+1 is the LSB determined by manipulation of switches of the MSB stage(s) 312 (and 334), to a pre-bit-selection state. In block 1204, reversions in the LSB stage(s) 314 (and 336) and the MSB stage(s) 312 (and 334) are concurrently performed in some implementations of the method 1200.

In block 1206, the SAR ADC 300 reverts the switches of the LSB stage(s) 314 (and 336) applied to determine a value of bit K−1 to a pre-bit-selection state. In block 1206, the SAR ADC 300 also reverts the switches of the MSB stage(s) 312 (and 334) applied to determine a value of bit N−1 to a pre-bit-selection state. The state of the switches of the MSB stage(s) 312 (and 334) applied to determine a value of the MSB (bit N) remain as set by the binary search process. The operations of blocks 1204 and 1206 reduce the signal dependent charge drawn from the reference voltage circuit by a little less than 16 (e.g., −15 in some examples). In block 1206, reversions in the LSB stage(s) 314 (and 336) and the MSB stage(s) 312 (and 334) are concurrently performed in some implementations of the method 1200.

Returning now to FIGS. 3A and 3B, in some implementations of the SAR ADC 300, the SAR control circuit 308 includes a CDAC reverse configuration look-up table 338. The CDAC reverse configuration look-up table 338 includes, for each possible digital output value generatable by the SAR ADC 300, a reversion configuration value for the switches of the CDAC 302 and the CDAC 304. After digitization of a sample of the input signal, the SAR control circuit 308 retrieves, from the CDAC reverse configuration look-up table 338, the reversion configuration value for the digital output value produced by the digitization, and sets the switches of the CDAC 302 and the CDAC 304 according to the reversion configuration value. Setting the switches to the reversion configuration value reduces the input signal dependent charge drawn from the reference voltage circuit by digitization of the input signal.

Modifications are possible in the described embodiments, and other embodiments are possible, within the scope of the claims.

What is claimed is:

1. An analog-to-digital converter (ADC), comprising:
a capacitive digital-to-analog converter (CDAC);
a comparator coupled to the CDAC;
a successive approximation register (SAR) control circuit coupled to the CDAC and the comparator, the SAR control circuit configured to:
successively select bits of a digital output value; and
after selection of the bits of the digital output value:
maintain a state of first switches of the CDAC applied to select a most significant bit of the digital output value; and
revert second switches of the CDAC applied to select bits of the digital output value having significance lower than the most significant bit to a state of the second switches prior to selection of the most significant bit.

2. The ADC of claim 1, wherein:
the digital output value comprises N bits;
an Nth bit is a least significant bit of the digital output value;
a 2rd bit is a 2nd most significant bit of the digital output value; and
the SAR control circuit is configured to:
after selection of the Nth bit, revert third switches of the CDAC applied to select bits of the digital output value having significance lower than the 2nd bit to a state of the third switches prior to selection of the 2nd bit; and
after reversion of the third switches of the CDAC applied to select bits of the digital output value having significance lower than the 2nd bit, revert fourth switches of the CDAC applied to select the 2nd bit to a state of the fourth switches prior to selection of the 2nd bit.

3. The ADC of claim 1, wherein:
the CDAC comprises:
a first array of capacitors;
a second array of capacitors coupled to the first array of capacitors by a coupling capacitor; and
the SAR control circuit is configured to:
after determination of the bits of the digital output value:
revert a state of third switches coupled to the second array of capacitors to a state of the third switches prior to selection of the most significant bit; and
revert a state of fourth switches coupled to the first array of capacitors to a state of the fourth switches prior to selection of the most significant bit.

4. The ADC of claim 3, wherein the SAR control circuit is configured to:
after reversion of the third switches coupled to the second array of capacitors, revert a state of fifth switches coupled to the second array of capacitors to a state of the fifth switches prior to selection of the most significant bit.

5. The ADC of claim 1, wherein:
the CDAC comprises:
a first array of capacitors; and
a second array of capacitors coupled to the first array of capacitors by a coupling capacitor; and
the SAR control circuit is configured to:
after determination of the bits of the digital output value:
revert third switches coupled to the first array of capacitors applied to select a first bit of the digital output value to a state of the third switches prior to selection of the first bit of the digital output value;
revert fourth switches coupled to the second array of capacitors applied to select a second bit of the digital output value to a state of the fourth switches prior to selection of the second bit of the digital output value; and
after reversion of the third switches applied to select the first bit and reversion of the fourth switches applied to select the second bit:
revert fifth switches coupled to the first array of capacitors applied to select a third bit of the digital output value to a state of the fifth switches prior to selection of the third bit of the digital output value; and
revert sixth switches coupled to the second array of capacitors applied to select a fourth bit of the digital output value to a state of the sixth switches prior to selection of the fourth bit of the digital output value.

6. The ADC of claim 5, wherein the SAR control circuit is configured to:
concurrently revert the third switches applied to select the first bit and the fourth switches applied to select the second bit; and
concurrently revert the fifth switches applied to select the third bit and the sixth switches applied to select the fourth bit.

7. The ADC of claim 5, wherein the SAR control circuit is configured to:
after reversion of the third switches applied to select the first bit and reversion of the fourth switches applied to select the second bit:
revert all switches coupled to the first array of capacitors applied to select a bit of the digital output value to a pre-bit-selection state.

8. A method, comprising:
digitizing a signal in a successive approximation register (SAR) analog-to-digital converter (ADC) to produce a digital output value; and
after determining values of all bits of the digital output value:
  reverting switches, of a capacitive digital-to-analog converter (CDAC) of the SAR ADC, applied to select all but a most significant bit of the digital output value to a state of the switches prior to selection of the most significant bit of the digital output value.

9. The method of claim 8, wherein:
the digital output value comprises N bits;
an Nth bit is a least significant bit of the digital output value;
a 2nd bit is a 2nd most significant bit of the digital output value; and
the method further comprises:
  after selection of the Nth bit, reverting first switches of the CDAC applied to select bits of the digital output value having significance lower than the 2nd bit to a state of the first switches prior to selection of the 2nd bit; and
  after reversion of the first switches of the CDAC applied to select bits of the digital output value having significance lower than the 2nd bit, reverting second switches of the CDAC applied to select the 2nd bit to a state of the second switches prior to selection of the 2nd bit.

10. The method of claim 8, wherein:
the CDAC comprises:
  a first array of capacitors;
  a second array of capacitors coupled to the first array of capacitors by a coupling capacitor; and
the method further comprises:
  after determination of all bits of the digital output value:
    maintaining a state of first switches coupled to the first array of capacitors applied to select the most significant bit of the digital output value;
    reverting a state of second switches coupled to the second array of capacitors to a state of the second switches prior to selection of the most significant bit; and
    reverting a state of third switches coupled to the first array of capacitors to a state of the third switches prior to selection of the most significant bit.

11. The method of claim 10, further comprising:
after reversion of the second switches coupled to the second array of capacitors, reverting a state of fourth switches coupled to the second array of capacitors to a state of the fourth switches prior to selection of the most significant bit.

12. The method of claim 8, wherein:
the CDAC comprises:
  a first array of capacitors; and
  a second array of capacitors coupled to the first array of capacitors by a coupling capacitor; and
the method further comprises:
  after determination of the bits of the digital output value:
    reverting first switches coupled to the first array of capacitors applied to select a first bit of the digital output value to a state of the first switches prior to selection of the first bit of the digital output value;
    reverting second switches coupled to the second array of capacitors applied to select a second bit of the digital output value to a state of the second switches prior to selection of the second bit of the digital output value; and
    after reversion of the first switches applied to select the first bit and reversion of the second switches applied to select the second bit:
      reverting third switches coupled to the first array of capacitors applied to select a third bit of the digital output value to a state of the third switches prior to selection of the third bit of the digital output value; and
      reverting fourth switches coupled to the second array of capacitors applied to select a fourth bit of the digital output value to a state of the fourth switches prior to selection of the fourth bit of the digital output value.

13. The method of claim 12, further comprising:
concurrently reverting the first switches applied to select the first bit and the second switches applied to select the second bit; and
concurrently reverting the third switches applied to select the third bit and the fourth switches applied to select the fourth bit.

14. The method of claim 12, further comprising:
after reversion of the first switches applied to select the first bit and reversion of the second switches applied to select the second bit:
  reverting all switches coupled to the first array of capacitors applied to select a bit of the digital output value to a pre-bit selection state.

15. An analog-to-digital converter (ADC), comprising:
a capacitive digital-to-analog converter (CDAC);
a comparator coupled to the CDAC;
a successive approximation register (SAR) control circuit coupled to the CDAC and the comparator, the SAR control circuit configured to:
  set switches of the CDAC to compare an input signal to be digitized to a digital value representative of the input signal;
  successively select all bits of a digital output value; and
  after selection of the bits of the digital output value, set the switches of the CDAC to a configuration that reduces input signal dependent charge drawn from a reference voltage circuit coupled to the CDAC.

16. The ADC of claim 15, wherein:
the SAR control circuit comprises a CDAC reverse configuration look-up table that stores a reversion configuration value for each digital output value; and
the SAR control circuit is configured to:
  select the reversion configuration value based on the digital output value; and
  apply the reversion configuration value to set the switches of the CDAC to a configuration that reduces input signal dependent charge drawn from the reference voltage circuit.

17. The ADC of claim 15, wherein:
the digital output value comprises N bits;
an Nth bit is a least significant bit of the digital output value;
a 2nd bit is a 2nd most significant bit of the digital output value; and
the SAR control circuit is configured to:
  after selection of the Nth bit, revert first switches of the CDAC applied to select bits of the digital output value having significance lower than the 2nd bit to a state of the first switches prior to selection of the 2nd bit; and after reversion of the first switches of the CDAC applied to select bits of the digital output value having significance lower than the 2nd bit, revert second switches of the CDAC applied to select the 2nd bit to a state of the second switches prior to selection of the 2nd bit.

18. The ADC of claim 15, wherein:
the CDAC comprises:
    a first array of capacitors;
    a second array of capacitors coupled to the first array of capacitors by a coupling capacitor; and
the SAR control circuit is configured to:
    after determination of the bits of the digital output value:
        maintain a state of first switches coupled to the first array of capacitors applied to select a most significant bit of the digital output value;
        revert a state of second switches coupled to the second array of capacitors to a state of the second switches prior to selection of the most significant bit; and
        revert a state of third switches coupled to the first array of capacitors to a state of the third switches prior to selection of the most significant bit.

19. The ADC of claim 18, wherein the SAR control circuit is configured to:
after reversion of the second switches coupled to the second array of capacitors, revert a state of fourth switches coupled to the second array of capacitors to a state of the fourth switches prior to selection of the most significant bit.

20. The ADC of claim 15, wherein;
the CDAC comprises:
    a first array of capacitors; and
    a second array of capacitors coupled to the first array of capacitors by a coupling capacitor; and
the SAR control circuit is configured to:
    after determination of the bits of the digital output value:
        revert first switches coupled to the first array of capacitors applied to select a first bit of the digital output value to a state of the first switches prior to selection of the first bit of the digital output value;
        revert second switches coupled to the second array of capacitors applied to select a second bit of the digital output value to a state of the second switches prior to selection of the second bit of the digital output value; and
        after reversion of the first switches applied to select the first bit and reversion of the second switches applied to select the second bit:
            revert third switches coupled to the first array of capacitors applied to select a third bit of the digital output value to a state of the third switches prior to selection of the third bit of the digital output value; and
            revert fourth switches coupled to the second array of capacitors applied to select a fourth bit of the digital output value to a state of the fourth switches prior to selection of the fourth bit of the digital output value.

* * * * *